(12) United States Patent
Varanasi et al.

(10) Patent No.: US 9,985,651 B2
(45) Date of Patent: *May 29, 2018

(54) READ THRESHOLD CALIBRATION FOR LDPC

(71) Applicant: Micron Technology, Inc., Boise, ID (US)

(72) Inventors: Chandra C. Varanasi, Broomfield, CO (US); Gerald L. Cadloni, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/604,757

(22) Filed: May 25, 2017

(65) Prior Publication Data

US 2017/0264312 A1 Sep. 14, 2017

Related U.S. Application Data

(63) Continuation of application No. 15/068,984, filed on Mar. 14, 2016, now Pat. No. 9,692,449, which is a
(Continued)

(51) Int. Cl.
*H03M 13/11* (2006.01)
*G11C 11/56* (2006.01)
(Continued)

(52) U.S. Cl.
CPC ....... *H03M 13/1102* (2013.01); *G06F 11/073* (2013.01); *G06F 11/076* (2013.01);
(Continued)

(58) Field of Classification Search
CPC . G11C 29/00; G11C 11/5621; G11C 16/3431; G11C 16/3454; G06F 11/1068;
(Continued)

(56) References Cited

U.S. PATENT DOCUMENTS 7,738,292 B2 6/2010 Radke
8,335,977 B2 * 12/2012 Weingarten et al. ......... 714/794
(Continued)

FOREIGN PATENT DOCUMENTS

TW 201018095 A1 5/2010

OTHER PUBLICATIONS

McGregor et al., "On the Hardness of Approximating Stopping and Trapping Sets in LPDC Codes," Information Theory Workshop, 2007, ITW '07, IEEE, Lake Tahoe, California, Sep. 2-6, 2007, pp. 248-253.
(Continued)

*Primary Examiner* — John J Tabone, Jr.
(74) *Attorney, Agent, or Firm* — Brooks, Cameron & Huebsch, PLLC

(57) ABSTRACT

Apparatuses and methods for soft read threshold location calibration are provided. One example method can include selecting read threshold sets (RTSs), and determining log-likelihood-ratios (LLRs) based on a number of decisions that correspond to each bin associated with the selected RTSs. Low-density parity-check (LDPC) codewords are decoded using the determined LLRs, and a RTS of the RTSs yielding a least number of failed codewords decoded using the determined LLRs is identified.

19 Claims, 4 Drawing Sheets

Related U.S. Application Data continuation of application No. 14/148,149, filed on Jan. 6, 2014, now Pat. No. 9,306,600.

(51) Int. Cl.
| | |
|---|---|
| *G06F 11/10* | (2006.01) |
| *G11C 16/34* | (2006.01) |
| *G06F 11/07* | (2006.01) |
| *G11C 29/00* | (2006.01) |
| *H03M 13/00* | (2006.01) |
| *H03M 13/37* | (2006.01) |
| *H03M 13/09* | (2006.01) |
| *H03M 13/45* | (2006.01) |

(52) U.S. Cl.
CPC ........ *G06F 11/079* (2013.01); *G06F 11/1012* (2013.01); *G06F 11/1068* (2013.01); *G06F 11/1072* (2013.01); *G06F 11/1076* (2013.01); *G11C 11/5621* (2013.01); *G11C 16/3454* (2013.01); *G11C 29/00* (2013.01); *H03M 13/09* (2013.01); *H03M 13/1105* (2013.01); *H03M 13/1111* (2013.01); *H03M 13/1128* (2013.01); *H03M 13/1131* (2013.01); *H03M 13/3723* (2013.01); *H03M 13/3738* (2013.01); *H03M 13/45* (2013.01); *H03M 13/611* (2013.01); *H03M 13/6325* (2013.01)

(58) Field of Classification Search
CPC .. G06F 11/076; G06F 11/079; G06F 11/1072; G06F 11/073; H03M 13/1111; H03M 13/1131; H03M 13/3738; H03M 13/09; H03M 13/1102; H03M 13/1105; H03M 13/2906; H03M 13/611
USPC ....... 714/764, 758, 763, 773, 752, 794, 704, 714/755, 6.11, 6.12, 760, 767, 799; 365/185.03, 185.2, 185.09, 185.18, 365/185.24; 711/154
See application file for complete search history.

(56) References Cited

U.S. PATENT DOCUMENTS

| | | | |
|---|---|---|---|
| 8,392,809 B1* | 3/2013 | Varnica et al. ............... 714/794 |
| 8,456,919 B1* | 6/2013 | Jeon et al. ............... 365/185.24 |
| 8,640,002 B1 | 1/2014 | Varanasi |
| 8,943,386 B1* | 1/2015 | Lee et al. ...................... 714/763 |
| 2007/0234184 A1 | 10/2007 | Richardson |
| 2008/0052564 A1 | 2/2008 | Yim et al. |
| 2009/0024905 A1 | 1/2009 | Shalvi et al. |
| 2009/0319860 A1* | 12/2009 | Sharon et al. ................ 714/752 |
| 2010/0088575 A1 | 4/2010 | Sharon et al. |
| 2010/0192043 A1* | 7/2010 | Alrod et al. .................. 714/763 |
| 2010/0241921 A1 | 9/2010 | Gunnam |
| 2011/0083060 A1* | 4/2011 | Sakurada et al. ............. 714/763 |
| 2011/0161775 A1* | 6/2011 | Weingarten ................... 714/755 |
| 2011/0231731 A1 | 9/2011 | Gross et al. |
| 2011/0320902 A1 | 12/2011 | Gunnam |
| 2012/0005551 A1 | 1/2012 | Gunnam |
| 2012/0005552 A1 | 1/2012 | Gunnam |
| 2013/0135927 A1* | 5/2013 | Jeon ......................... 365/185.03 |
| 2013/0163328 A1* | 6/2013 | Karakulak et al. ........ 365/185.2 |
| 2013/0229867 A1* | 9/2013 | Tang et al. ................. 365/185.2 |
| 2014/0223264 A1* | 8/2014 | Zeng et al. ................... 714/773 |
| 2015/0052408 A1* | 2/2015 | Lee et al. ...................... 714/704 |
| 2015/0149871 A1* | 5/2015 | Chen et al. ................... 714/773 |
| 2015/0154064 A1* | 6/2015 | Ghaly et al. ................. 714/6.11 |
| 2015/0154065 A1* | 6/2015 | Ghaly et al. |
| 2015/0169401 A1* | 6/2015 | Tseng ........................... 714/773 |

OTHER PUBLICATIONS

Laendner et al., "LDPC Codes Based on Latin Squares: Cycle Structure, Stopping Set, and Trapping Set Analysis," IEEE Transactions on Communications, vol. 55, No. 2, pp. 303-312, Feb. 2007.

Zhang et al., "Lowering LDPC Error Floods by Postprocessing," Global Telecommunications Conference 2008, IEEE Globecom 2008, New Orleans, LA, USA, Nov. 30, 2008-Dec. 4, 2008, 6 pp.

Kyung et al., "Exhaustive Search for Small Fully Absorbing Set and the Corresponding Low-Error-Floor Decoder," IEEE International Symposium on Information Theory, Austin, TX, USA, Jun. 13, 2010, pp. 739-743.

Cover, "Enumerative Source Encoding," IEEE Transactions on Information Theory, Jan. 1973, 5 pp.

Wang et al., "Soft Information for LDPC Decoding in Flash: Mutual-Information Optimized Quantization," IEEE Global Telecommunications Conference (GLOBECOM 2011), Houston, TX, Dec. 5-9, 2011, 6 pp.

Peleato, et al. "Towards Minimizing Read Time for Nand Flash", IEEE Global Communications Conference, 2012, pp. 1-6.

* cited by examiner

READ THRESHOLD CALIBRATION FOR LDPC

PRIORITY INFORMATION

This application is a Continuation of U.S. application Ser. No. 15/068,984 filed Mar. 14, 2016, which is a Continuation of U.S. application Ser. No. 14/148,149 filed Jan. 6, 2014, now U.S. Pat. No. 9,306,600, the specifications of which are incorporated herein by reference.

TECHNICAL FIELD

The present disclosure relates generally to error correction, and more particularly, to apparatuses and methods for read threshold calibration.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAIVI), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Further, when data, e.g., data stored in memory, is transmitted from one location to another there is the possibility that an error may occur. Errors can also occur over time while data is stored in a memory. There are a number of techniques that can be used to encode data so that an error can be detected and/or corrected. Since data is routinely transmitted to and from memory, and stored therein, memory can employ error correction techniques to attempt to correct data associated with the memory.

One type of error correction involves a low-density parity-check (LDPC) technique. Unencoded, e.g., "raw" data can be encoded into codewords for transmission and/or storage. The codewords can subsequently be decoded to recover the data. However, the success of properly decoding the codeword can depend on the nature and extent of errors that occur to the encoded codeword during transit and/or storage.

DETAILED DESCRIPTION

Figure 1:
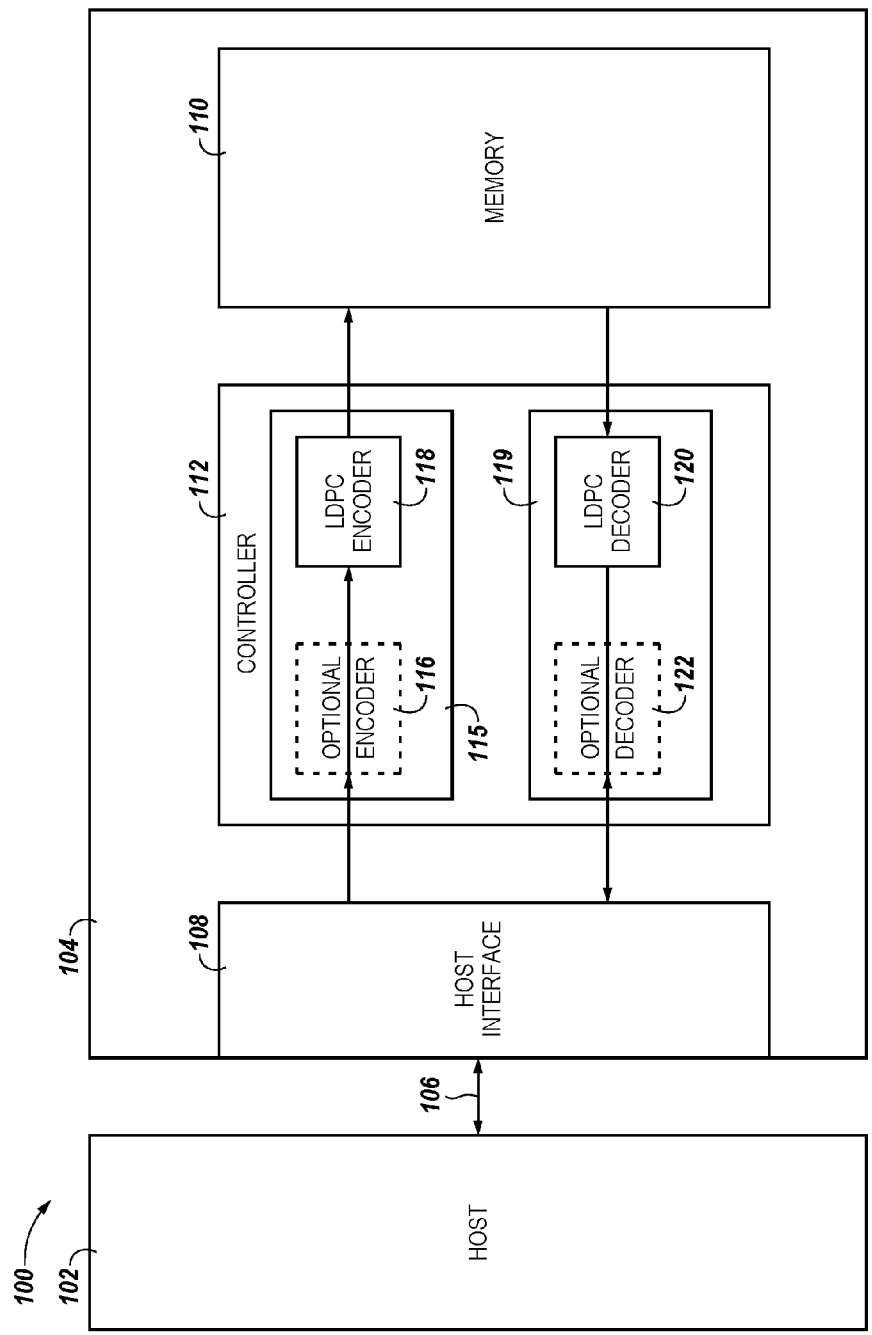
FIG. 1 is a functional block diagram of an apparatus in the form of a computing system including at least one memory system, in accordance with a number of embodiments of the present disclosure.

Apparatuses and methods for read threshold location calibration are provided. One example method can include selecting read threshold sets (RTSs), and determining log-likelihood-ratios (LLRs) based on a number of decisions that correspond to each bin associated with the selected RTSs. Low-density parity-check (LDPC) codewords are decoded using the determined LLRs, and a RTS of the RTSs yielding a least number of failed codewords decoded using the determined LLRs is identified.

Communication channel noise, increases in communication speed, and increases in storage density can each provide opportunities for the introduction of errors to the data being transmitted and/or stored. With particular respect to storage of data in a memory, it has been observed that memory cells, e.g., charge storage memory cells, can have a finite endurance. The quantity of data states per memory cell, and therefore smaller detectable differences between data states, as well as the quantity of program and erase cycles, can affect the reliability of the data stored therein. For example, the greater the quantity of data states per memory cell and/or the greater the quantity of program/erase cycles to which a memory cell is subjected, the lower reliability of accurately determining the data that was stored by the cell. Programming a memory cell repeatedly and/or repeatedly at relatively higher voltage levels can cause physical degradation of the memory cell resulting in increased likelihood of error introduction.

Increases in errors and/or decreases in reliability can lead to use of stronger error-correction techniques to detect, and/or timely correct, errors, for instance. Algebraic error-correction codes such as Bose, Chaudhuri, and Hocquenghem (BCH) codes can be used to correct a fixed number of errors in data, e.g., data stored in Flash memory devices. Data processing error correcting codes such as low-density parity-check (LDPC) codes, can out-perform BCH codes.

Data can be expressed in a sequence of digits, e.g., bits. Data can further be encoded, for instance, into codewords. The codewords can comprise multiple digits. The digits of a codeword are sometimes referred to herein as code digits, e.g., code bits, so as to distinguish from the digits of the original data.

LDPC codes are linear block codes defined by parity-check matrices. In addition to error-correction capabilities, LDPC codes can use low-complexity iterative algorithms for decoding. An LDPC decoder can use soft reliability information about the received data state(s), e.g., determined by a hard read operation, to improve decoding performance.

According to various embodiments of the present disclosure, best thresholds, e.g., locations of thresholds, for reads, e.g., soft reads, can be evaluated. A likelihood ratio can summarize the probability of one outcome of an event relative to the probability of another outcome of the event. A logarithm can be taken of the likelihood ratio to arrive at the log-likelihood-ratio (LLR), which can simplify using the ratio because the logarithm function can reduce wide-ranging quantities to smaller scales for easier use. LLRs can be computed corresponding to soft read thresholds for unique sets of the soft read thresholds.

As discussed herein, LDPC codewords can be decoded using sets of soft read thresholds and associated LLRs. The sets of soft read thresholds that result in a least number of failed codewords can be selected and/or ranked according to performance in successfully decoding codewords. Thereafter, attempts can be made to decode LDPC codewords using the ranked sets of soft read thresholds, in rank order, beginning with the highest ranked set of soft read threshold and proceeding with successively lower-ranked sets of soft read thresholds until successful decode is accomplished (or attempts at decode are terminated as unsuccessful).

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of an apparatus in the form of a computing system 100 including at least one memory system 140, in accordance with a number of embodiments of the present disclosure. Although the apparatus and methods of the present disclosure are illustrated with respect to a computing system, and more particularly with respect to decoding data read from memory, embodiments of the present disclosure are not so limited and can be implemented in other manners, such as in decoding data received through a communication channel with other devices in a vertical distributed computing environment, etc.

As illustrated in FIG. 1, a host 102 can be communicatively coupled to a memory system 104, such as by a communication channel 106. As used herein, a memory system 104, a controller 112, or a memory 110, e.g., memory device, might also be separately considered an "apparatus." The memory system 104 can be used as a mass data storage memory system in the computing system 100, e.g., an enterprise solid state storage appliance. Alternatively, the memory system 104 can be used as an external, or portable, memory system for computing system 100, e.g., a portable solid state drive (SSD) with plug-in connectivity such as a thumb drive, etc.

The memory system 104 can include a host interface 108, a controller 112 (e.g., a processor and/or other control circuitry), and a memory 110, which provides a storage volume for the memory system 104. The memory 110 can be comprised of a number of memory devices (not individually shown for simplicity), e.g., solid state memory devices such as NAND flash devices, etc. In a number of embodiments, the controller 112, the memory 110, and/or the host interface 108 can be physically located on a single die or within a single package, e.g., a managed NAND application. Also, in a number of embodiments, a memory can include a single memory device.

Figure 2:
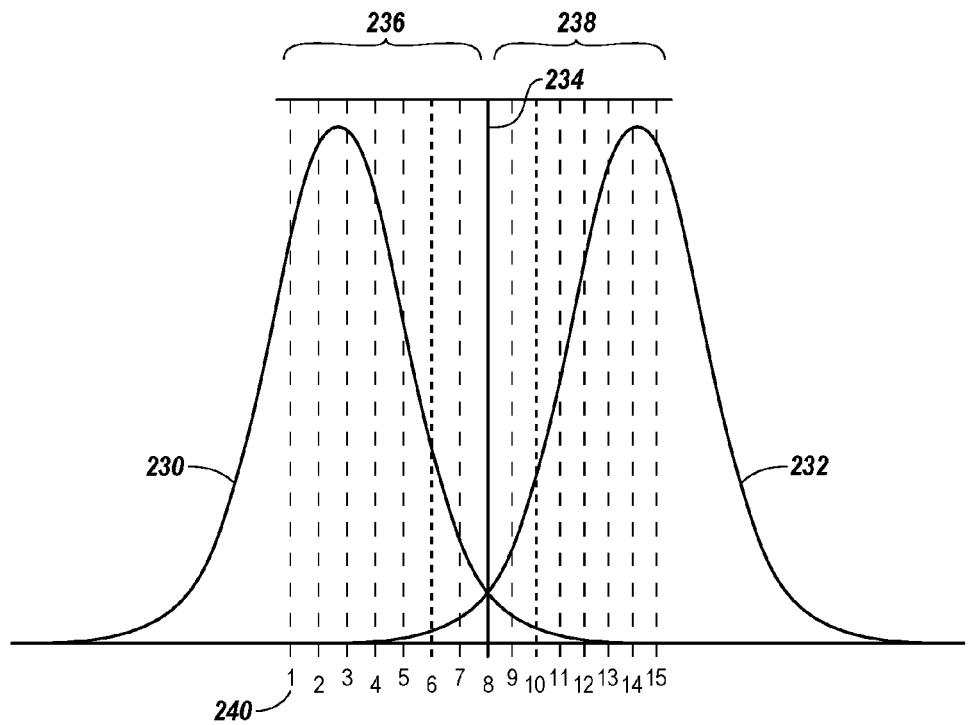
FIG. 2 is a graph showing voltage distributions corresponding to two data states and multiple thresholds therebetween, in accordance with a number of embodiments of the present disclosure.

Communication channel 106 can be located between the host 102 and the memory system 104, for example. As shown in FIG. 2, communication channel 106 can be located outside one or both of the host and/or the memory system 104. Communication channel 106 can be a cable or bus, such as a serial advanced technology attachment (SATA), peripheral component interconnect express (PCIe), or a universal serial bus (USB), or other interface.

The memory system 104 can include a controller 112 communicatively coupled to memory 110. The controller 112 can be communicatively coupled to a host interface 108, which can be communicatively coupled through communication channel 106 to the host 102. The host interface 108 can be connected to the communication channel 106, and include, for example, a compatible connector and/or other receptor for the communication channel 106. For a number of embodiments, the host interface 108 can be in the form of a standardized interface, such as those listed above, or can be compatible with other connectors and/or interfaces. The host interface 108 on the memory system 104 is used to communicate data between the memory 110 and the host 102. For example, the host interface 108 can provide an interface for passing control, address, user data, and other signals between the memory 110 and the host 102.

Host 102 and/or host interface 108 can include a memory access device, e.g., a processor, and/or other computing components. One of ordinary skill in the art will appreciate that "a processor" can intend a number of processors, such as a parallel processing system, a number of coprocessors, etc. Examples of host 102 include a desktop computer, a mobile telephone, a server, a laptop computer, a personal computer, a digital camera, a digital recording and playback device, a personal digital assistant (PDA), a memory card reader, an interface hub, etc.

Memory 110 can be a non-transitory media, and include a number of arrays of memory cells, e.g., non-volatile memory cells. The arrays can be Flash arrays with a NAND architecture, for example. However, embodiments of the present disclosure are not limited to a particular type of memory array or array architecture. The methods and apparatuses of the present disclosure can also be used or implemented with other memory cells, such as memory cells typically used in, for example, DRAM, PCRAM, and/or RRAM memories. The memory 110 can include a number of storage nodes, e.g., groups of memory cells (detail not shown in FIG. 1).

The controller 112 can include logic configured for a number of functions such as error correction coding (ECC), performing physical to logical mapping, "in-flight" data buffering, block management, e.g., wear leveling, and communications interfaces with the memory 110. The controller 112 can translate commands received from the host 102 into appropriate commands to accomplish an intended memory operation, and thereby provide a translation layer between the host 102 and the memory 110. Controller 112 can also process host command sequences and associated data, and other data, to the appropriate memory command sequences in order to store and retrieve data, for example.

The controller 112 can communicate with the memory 110 to operate, e.g., read, write, move, program, sense, erase, the memory cells. Thus, controller 112 can manage communications with, and the data stored in, the memory 110. The controller 112 can have circuitry utilizing a number of integrated circuits, as well as other discrete components. In various embodiments, the controller 112 can be hardware in the form of an application specific integrated circuit (ASIC) coupled to a printed circuit board including the host interface 108, and/or the memory 110.

The memory system 104, memory 110, and/or controller 112 can include additional circuitry that is not illustrated so as not to obscure embodiments of the present disclosure. For example, although not specifically illustrated, in some embodiments, the memory can include a plurality of components each coupled to the controller 112 by a respective channel. The controller 112 can include a discrete memory channel controller for each channel. The controller 112 can include, for example, a number of components in the form of hardware and/or firmware (e.g., a number of integrated circuits) and/or software for controlling access to the memory 110. As used herein, the memory system 104, the controller 112, or the memory 110 might also be implemented separately and/or considered an "apparatus."

The controller 112 can also include logic configured for encoding and decoding data being transmitted to and/or received from the memory 110. As illustrated in FIG. 1, the controller 112 can include a number of error coding/decoding components, e.g., encoder/decoder implementing an error correction code (ECC) engine. The error coding components can be configured to encode data, e.g., user data, received from the host 102 to be stored in the memory 110.

According to a number of embodiments, the controller 112 can include a first encoding portion 115 and/or a first decoding portion 119. For example, the controller 112 can include a low-density parity check (LDPC) encoder 118, an LDPC decoder 120, and optionally other encoders and/or decoders such as a BCH (Bose, Chaudhuri, and Hocquenghem) encoder 116, and/or a BCH decoder 122. User data can be encoded using a linear error correcting code such as an LDPC code.

Encoding and/or decoding of the data can be accomplished in hardware and/or software, such as in the controller 112, the memory 110 before communication to the controller 112, and/or at the host 102. An encoder 118 receives unencoded data and provides encoded data. Encoder 118 can receive, e.g., from a host 102, k digits of data, e.g., a k-digit codeword, and generate n digits of data, e.g., an n-digit encoded codeword. As used herein, a "digit" refers to a digit of data, such as a binary digit, e.g., bit, a hexadecimal digit, etc.

As used herein, a "codeword" refers to a combination of digits of data, such as input data, e.g., user data. A codeword can include a particular amount of data which may correspond to a data transfer size of the memory 110 and/or host 102, for example. A codeword can include additional digits as a result of encoding, such as parity digits, for example. The n-digit encoded codeword can uniquely correspond to the k-digit codeword. The n-digit encoded codeword can be stored in the memory 110 in place of the k-digit codeword.

Decoders 120/122 receive encoded data and provide the original data. Decoders 120/122 can receive, e.g., from memory 110, n digits of data, e.g., an n-digit encoded codeword and generate k digits of data, e.g., an k-digit codeword. The encoding and decoding process can be such that errors in the encoded codeword can be detected and/or corrected during the decoding process.

Although illustrated as components within the controller 112 in FIG. 1, each of the error coding components can be external to the controller 112, or a number of components can be located within the controller 112 and a number of components can be located external to the controller 112.

FIG. 2 is a graph showing voltage distributions corresponding to two data states and multiple thresholds therebetween, in accordance with a number of embodiments of the present disclosure. Although FIG. 2 illustrates voltage distributions as may be applicable to charge storage type memory cells, the techniques described herein can be adapted for use with other types of memory cells such as phase change type memory cells that utilize variable current/voltage/resistance characteristics to delineate different data states.

FIG. 2 shows one model of a first threshold voltage (Vt) distribution 230, a second threshold voltage distribution 232, and a hard read threshold, e.g., voltage, 234 located at a transition, e.g., valley, between the two threshold voltage distributions associated with a group of memory cells, e.g., page, block, etc. A "hard read" operation provides hard data. Hard data is information with respect to a hard read threshold 234. That is, a hard read operation can make a determination as to whether a memory cell is in a condition associated with the data state(s) on either side of the hard read threshold. For example, a 2-bit memory cell can be programmed to one of four data states, where each data state corresponds to one of data 00, 01, 10, or 11.

In other words, hard data is data that corresponds to the data state of a memory cell. A charge storage memory cell can be charged to a voltage level that is less than or greater than a voltage level of the hard read threshold 234. One data state can be associated with the memory cell being charged to a voltage level that is less than the voltage level of the hard read threshold 234, and another data state can be associated with the memory cell being charged to a voltage level that is greater than the voltage level of the hard read threshold 234. In contrast, soft data can provide confidence information with respect to the location of threshold voltage (Vt) upon which the hard read was based, and thus can provide confidence information with respect to the data state read from the memory cell.

A soft read operation can provide soft data. Broadly, soft data is gathered to provide confidence information, e.g., attach a confidence value, to the hard data. In other words, soft data can indicate a confidence level of a hard read determination. Referring to FIG. 2, a hard read determination can be made with respect to threshold 8. That is, a hard read operation can determine whether the Vt of the memory cell is to the left, or to the right, of threshold 8. Soft read operations can make additional determinations with respect to the additional thresholds shown on FIG. 2, e.g., 1-7 and 9-15 in order to refine the hard read determination. Each soft read operation can determine whether the Vt of the memory cell is to the left, or to the right, of a particular threshold.

In testing thresholds other than the threshold upon which the heard read is based, the location of the Vt of the memory cell can be more precisely located. The further away the Vt of the memory cell is actually located from the threshold upon which the hard read is based, e.g., threshold 8 in FIG. 2, more confidence is attributed to the hard read determination. Conversely, the closer the Vt of the memory cell is actually located to the threshold upon which the hard read is based, less confidence is attributed to the hard read determination.

A codeword can be comprised of raw data, e.g., bits, initially determined by a hard read. As such, the codeword can initially be hard data. Along with the hard data comprising the codeword, a decoder can receive soft data that corresponds to the bits of hard data comprising the codeword. The accompanying soft data can be provided by the memory, e.g., along with the hard data. The soft data can be based on soft read(s) of a memory cell, e.g., following a hard read of the memory cell to determine a bit of the codeword. The soft data can indicate confidence information about the hard data comprising the codeword. Although "bits" are referred to here as an example, digits of a codeword are not limited to binary configurations and embodiments of the present disclosure can be based on codewords comprised of other multi-state digits in addition to binary bits.

A memory device can be configured to determine a particular number of soft data bits for hard data read therefrom. For the 2-bit memory cell described above, an example of soft data could include a greater resolution that uses four bits, which could otherwise represent up to sixteen different states. The resolution of the soft data can depend on the number of reads made to locate the Vt stored on the memory cell for those embodiments employing discrete read signals, where more reads can provide greater resolution.

For example, for a single level (memory) cell (SLC), a data state of "1" can be associated with the first threshold voltage distribution 230 and a data state of "0" can be associated with the second threshold voltage distribution 232. Accordingly, the hard read threshold 234 can be used to determine whether a "1" data state or a "0" data state is stored in the memory cell. However, embodiments of the present disclosure are not so limited and FIG. 2 can also be read as showing two threshold voltage distributions of a multi-level (memory) cell (MLC). The voltage level to which a memory cell is charged relative to the hard read threshold 234 can be determined, for example using a sense amplifier comparator.

FIG. 2 also shows a number, e.g., M, of initial read thresholds (IRTs) 240, e.g., initial soft read threshold voltages. According to various embodiments, the initial soft read thresholds 240 can be located around the transition between two threshold voltage distributions 230 and 232. A first portion 236 of the initial soft read thresholds 240 can be located on a first side of the hard read threshold 234 (and/or transition), and a second portion 238 of the initial soft read thresholds 240 can be located on a second side of the hard read threshold 234 (and/or transition). As shown in FIG. 2, one initial soft read threshold 240, e.g., soft read threshold "8" in the example, can correspond to the hard read threshold 234.

Although FIG. 2 shows 15 (numbered 1-15) initial soft read thresholds 240, embodiments of the present disclosure are not limited to this quantity, and more, or fewer, initial soft read thresholds 240 can be defined. Nor are embodiments of the present disclosure limited to an odd number of initial soft read thresholds 240, and some embodiments have an even number of initial soft read thresholds 240. Also, although FIG. 2 shows one initial soft read threshold 240 at the same location as the hard read threshold 234, embodiments are not so limited and initial soft read thresholds 240 can be skewed from the hard read threshold 234, e.g., equally-spaced from the hard read threshold 234.

According to various embodiments a number, e.g., 15, initial soft read thresholds 240 can be defined around two threshold voltage distributions, with one initial soft read threshold 240. The initial soft read thresholds 240 can be numbered 1, 2, 3 . . . , starting from a left-most location. However, embodiments are not so limited and can be indexed, e.g., referenced, using other nomenclature, e.g., letters, symbols, coordinates, etc. For an odd number of initial soft read thresholds 240, a middle one of the initial soft read thresholds 240 can be located at a location between the two threshold voltage distributions that gives the best residual bit error rate (RBER), e.g., at the hard read threshold 234.

While embodiments of the present disclosure illustrate the initial soft read thresholds 240 being symmetrically arranged around a transition between two threshold voltage distributions corresponding to respective data states and/or a hard read threshold 234, embodiments are not so limited. Also, the initial soft read thresholds 240 are shown in FIG. 2 as being evenly spaced from one another. Embodiments are not so limited and spacing between initial soft read thresholds 240 can be uniform or non-uniform, equal or varying, such as by distance away from some reference, e.g., a center initial soft read threshold 240 or threshold voltage distribution(s) feature. The initial soft read thresholds 240 can be spread further apart or located closer together than is represented in FIG. 2.

Also, the initial soft read thresholds 240 can be located so as to have a center initial soft read threshold 240 offset from a threshold voltage distribution(s) feature, e.g., transition between two threshold voltage distributions, or from the hard read threshold 234. For example, the initial soft read thresholds 240 can be arranged to have more initial soft read thresholds 240 located to one side of a transition between two threshold voltage distributions and/or a hard read threshold 234 than are located on an opposite side of the transition between two threshold voltage distributions and/or a hard read threshold 234. The two Gaussian noisy threshold voltage distributions 230 and 232 shown in FIG. 2 are depicted being symmetrical and noisy, both of which can impact a best location for arranging the initial soft read thresholds 240 to improve decoding results as discussed further below.

A soft read operation can provide soft information about a threshold(s) between two threshold voltage distributions used to determine one or more data states. Soft information can be obtained, for example, by reading from a same sense amplifier comparator multiple times with different soft read threshold voltages, e.g., word line voltages (as may be done for multi-level memory cell arrangements), or by multiple sense amplifiers each evaluating a corresponding different soft read threshold voltage.

Figure 3:
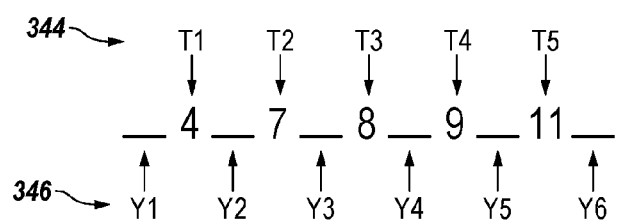
FIG. 3 is a diagram illustrating a read threshold set, in accordance with a number of embodiments of the present disclosure.

FIG. 3 is a diagram illustrating a read threshold set, in accordance with a number of embodiments of the present disclosure. FIG. 3 shows a read threshold set (RTS), e.g., soft read threshold set, having a number, e.g., M, read thresholds, e.g., soft read thresholds, and "bins" 346 associated with the read thresholds of the RTS. Each soft read threshold corresponds to a different location along a voltage distribution. Therefore, identifying a particular RTS from among a plurality of RTSs amounts to a (soft) read threshold (location) calibration. Each RTS has a unique combination of soft read thresholds.

According to various embodiments of the present disclosure, a number of soft read thresholds are selected from the initial soft read thresholds, e.g., initial soft read thresholds 240 designated 1 through 15 as shown in FIG. 2. For example, of 15 initial soft read thresholds, a group of 5 soft read thresholds can be selected. FIG. 3 shows a number of soft read thresholds selected from the initial soft read thresholds, e.g., 240 shown in FIG. 2. In this example, the selected soft read thresholds include initial soft read thresholds 4, 7, 8, 9, and 11. The remaining initial soft read thresholds, e.g., 1-3, 5, 6, 10, and 12-15, were not included in the selected group example shown in FIG. 3.

Unique groups of a number (N) soft read thresholds, e.g., 5 selected, soft read thresholds, that can be chosen from the M, e.g., 15, initial soft read thresholds can be indicated $$\binom{M}{N},$$

which is notation to represent "M choose N." For any set containing N elements, the number of distinct M-element subsets that can be formed is given by the binomial coefficient $$\binom{M}{N},$$

which can also be expressed as $$\left(\frac{M!}{N!(M-N)!}\right).$$

Therefore for the example of 15 initial soft read thresholds from which groups of 5 are selected, the number of possible unique RTSs equals 3003, i.e., $$\binom{15}{5} = 3003.$$

For example, if the initial soft read thresholds are numbered 1, 2, 3, . . . , 15, then the list of 3003 possible RTSs are: {1 2 3 4 5}, {1 2 3 4 6}, {1 2 3 4 7}, . . . , {11 12 13 14 15}. The particular RTS shown in FIG. 3 is {4 7 8 9 11}. However, embodiments of the present disclosure are not limited to 15 initial soft read thresholds and/or RTSs having 5 members, and can be implemented with more or fewer initial soft read thresholds and/or more or fewer members in an RTS. The number of possible unique RTSs can vary depending in the quantity of initial soft read thresholds and/or the quantity of members comprising an RTS.

The members of the RTS shown in FIG. 3 are associated with a threshold index 344, e.g., soft read threshold 4 is designated threshold number 1 (T1), soft read threshold 7 is designated threshold number 2 (T2), soft read threshold 8 is designated threshold number 3 (3), soft read threshold 9 is designated threshold number 4 (T4), and soft read threshold 11 is designated threshold number 5 (T5). Although indices T1-T5 are shown in FIG. 3, embodiments of the present disclosure are not so limited and other indices can be used including other numeric ranges, letters, etc.

A "bin," e.g., "bucket," refers to a specific range of voltage values into which the Vt of a memory cell may be within. The quantity, e.g., count, of decisions made with respect to particular threshold, e.g., T1-T5 can correspond to a bin on one or the other side of the particular threshold. The number of decisions that correspond to particular bins can be counted and further analysis conducted based on the number of decisions that correspond to particular bins. Counting of decisions in particular bins can be implemented, for example, with a counter or accumulator, in software or in hardware. FIG. 3 shows 6 bins 346 associated with the 5 members of the RTS illustrated. More generally, there can be N+1 bins associated with the N members of an RTS.

According to various embodiments, the data state, e.g., bit value, written in the memory cell on a particular block or page can be denoted by "X" and the bin by a Y#. The bins shown in FIG. 3 are associated with a bin index 346. That is, the bins can be numbered, for example, Y1, Y2, Y3, Y4, Y5, and Y6 from left-to-right. Note that bin Y1 can be used to count the quantity of decisions on one side of threshold T1, e.g., soft read threshold 4, and bin Y2 can be used to count the quantity of decisions on the other side of threshold T1. Additionally, bin Y2 can be used to count the quantity of decisions on one side of threshold T2.

While an RTS comprises multiple thresholds, for example as shown in FIG. 3, the thresholds are tested individually and not necessarily simultaneously as a group of multiple thresholds. As such, a decision for a data state to the right of threshold T1 will be counted in bin Y2 without regards as to how far to the right of threshold T1 (which can't be determined just by a decision with respect to threshold T1. That is, bin Y2 may not count the quantity of decisions between the T1 and T2 thresholds, but rather is used to count the quantity of decisions to the right of threshold T1 and to the left of threshold T2. It should be noted that a decision with respect to threshold T1 will only be counted in one of bins Y1 or Y2, and will not be counted in in bins Y3-Y6; a decision with respect to threshold T2 will only be counted in one of bins Y2 or Y3, and will not be counted in in bins Y1 or Y4-Y6, etc. Eventually, e.g., by testing with respect to multiple thresholds of the RTS, a Vt for a memory cell will correspond to one particular bin. The Vt will correspond to the bin bounded by thresholds Ti and T(i+1), where Ti is the threshold, e.g., last threshold, that results in a decision of Vt being located to the left thereof, and T(i+1) is the threshold, e.g., first threshold, that results in a decision of Vt being located to the right thereof.

According to various embodiments of the present disclosure, a log-likelihood-ratio (LLR) can be determined with respect to each bin, e.g., based on the number of decisions that correspond to particular bins. In other words, an LLR can be determined for each region between thresholds of an RTS. It should be observed that the regions between thresholds of an RTS may not be uniform. For example, the region between T1 and T2 is greater than the region between T2 and T3 for the RTS members illustrated in FIG. 3. Other RTS can have same or different threshold spacings since RTS members are a unique set.

Each threshold of an RTS can be used to make a decision as to whether a particular memory cell is charged to a voltage greater than or less than the threshold. A decision with respect to a threshold can be indicated as a data state, e.g., 1 if the voltage to which memory cell is charged is less than the threshold (voltage) or 0 if the voltage to which memory cell is charged is greater than the threshold (voltage).

In evaluating whether a particular threshold is an effective boundary for determining data states, probabilities of each data state determinations associated with the particular threshold can be compared, and the comparison expressed as an LLR. An LLR can be determined for each of N+1 bins as follows:

$$LLR(Y_i) = \log\left(\frac{P\left(\frac{X=0}{Y_i}\right)}{P\left(\frac{X=1}{Y_i}\right)}\right). \quad \text{Eq. A}$$

The ratio expressed above (of which the log is computed) for each bin $Y_i$ is the probability that the data state, e.g., bit, is a 0 divided by the probability that the data state, e.g., bit, is a 1. Bayes's rule can be used to simplify the LLR computation to:

$$LLR(Y_i) = \log\left(\frac{\text{Number\_of\_0's\_in\_the\_Page\_in\_the\_bin}}{\text{Number\_of\_1's\_in\_the\_Page\_in\_the\_bin}}\right). \quad \text{Eq. B}$$

Details of the expression using Bayes's rule is provided below. The number of 0's or 1's that end up in a bin can be for a specific portion of memory such as for a page, block, or other portion. For the example illustrated here, a page of memory cells is assumed; however, embodiments of the present disclosure are not so limited and other memory portion designations can be used.

Expression of the LLR equation using Bayes's rule is detailed as follows. Consider the multiplication of probabilities, e.g., Probability A×Probability B (given A):

$$P\left(\frac{X=0}{Y_i}\right)P(Y_i) = P(X=0)P\left(\frac{Y_i}{X=0}\right) \quad \text{Eq. C}$$

$$P\left(\frac{X=1}{Y_i}\right)P(Y_i) = P(X=1)P\left(\frac{Y_i}{X=1}\right) \quad \text{Eq. D}$$

Dividing equation C by equation D:

$$\frac{P\left(\frac{X=0}{Y_i}\right)P(Y_i)}{P\left(\frac{X=1}{Y_i}\right)P(Y_i)} = \frac{P(X=0)}{P(X=1)} \cdot \frac{P\left(\frac{Y_i}{X=0}\right)}{P\left(\frac{Y_i}{X=1}\right)}$$

Substituting count quantities for the probabilities:

$$P(X=0)P\left(\frac{Y_i}{X=0}\right) = \quad \text{Eq. E}$$
$$\left(\frac{\text{Number\_of\_0's\_in\_Page}}{\text{Total\_Number\_of\_bits\_in\_Page}}\right)\left(\frac{\text{Number\_of\_0's\_in\_bin}}{\text{Number\_of\_0's\_in\_Page}}\right)$$

$$P(X=1)P\left(\frac{Y_i}{X=1}\right) = \quad \text{Eq. F}$$
$$\left(\frac{\text{Number\_of\_1's\_in\_Page}}{\text{Total\_Number\_of\_bits\_in\_Page}}\right)\left(\frac{\text{Number\_of\_1's\_in\_bin}}{\text{Number\_of\_1's\_in\_Page}}\right)$$

Dividing the penultimate equation (Eq. E) by Eq. F, then computing the logarithm yields Equation B above.

Figure 4:
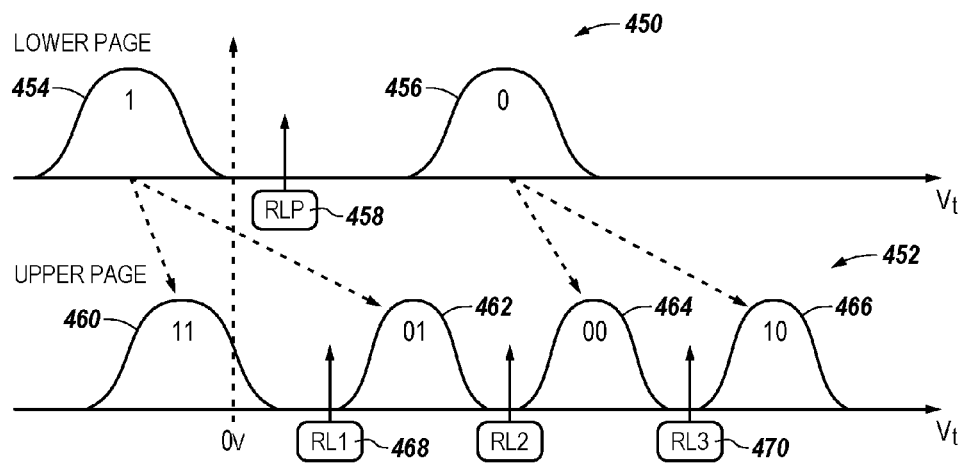
FIG. 4 is a diagram illustrating multiple page reads for a multi-level cell (MLC), in accordance with a number of embodiments of the present disclosure.

FIG. 4 is a diagram illustrating multiple page reads for a multi-level cell (MLC), in accordance with a number of embodiments of the present disclosure. For an SLC page read (with an RTS having a plurality of read thresholds among the two threshold voltage distributions) a strong 1 data state can correspond to bin Y1 and a strong 0 data state can correspond to bin Y6, for example. For an MLC, e.g., 2 data states, or more, per memory cell, multiple reads can be used to determine between multiple data states.

The upper portion of FIG. 4 (labeled LOWER PAGE) depicts a Lower Page Only (LPO) without upper page, which is similar to an SLC programmed arrangement. All MLC pages are first programmed as LPO and are capable of being read as LPO. The hard read threshold, shown in FIG. 4 as RLP, can be used to determine between the "1" or "0" state. At some later time, these pages can get another page programmed into them. At that time, the "1" states split from one distribution to two distributions "11" and "01," as depicted by the dotted lines. Also at that time, the "0" states split from one distribution to two distribution "00" and "10," as depicted by the dotted lines. So, this portion of FIG. 4 depicts how MLC pages start out as LPO pages and become MLC pages with two programming events to the same memory cells.

The lower portion of FIG. 4 (labeled UPPER PAGE) depicts a fully programmed MLC arrangement. The Lower Page can be determined with the RL2 read threshold shown in FIG. 4. The least significant bit (LSB) for each of the distributions on a respective side of RL2 correspond to the Lower Page state. The two states, i.e., "11" and "01," on one side of RL2 corresponds to the "1" distribution for the Lower Page. The two states, i.e., "00" and "10," on the other side of RL2 corresponds to the "0" distribution for the Lower Page.

The Upper Page can be determined with the RL1 and RL3 read thresholds shown in FIG. 4, which are used simultaneously on an Upper Page read. The RL1 threshold can be used to determine the "11" to "01" state changes, e.g., most significant bit (MSB) from "1" to "0." The RL3 threshold can be used to determine the "00" to "10" state changes, e.g., MSB from "0" to "1." The MSB corresponds to Upper Page states.

More specifically, a hard lower page read of an MLC arrangement 452, can attempt a determination between a first threshold voltage distribution 460 and 462 (corresponding to a lower page data state 1 data state) and a second threshold voltage distribution 464 and 466 (corresponding to a lower page data state 0 data state) based on a lower page read threshold RL2. The M initial soft read thresholds can be selected from among the two voltage threshold distributions (462 data state "01" and 464 data state "00"), such as being centered on the lower page read threshold RL2 between the two data states. An RTS having a unique combination of N soft read thresholds deterministically chosen from the M initial soft read thresholds can be defined, and N+1 bins can be associated with the N thresholds of the RTS. For the lower page read, a strong 1 data state can correspond to bin Y1 and a strong 0 data state can correspond to bin Y6, for example.

An upper page read can be used, e.g., after the lower page read, to differentiate between a more significant, e.g., multilevel, data state values, e.g., bits, where data states are arranged according to a Gray coding scheme, as shown in FIG. 4 at 452. The upper page read can be used to determine between pairs of multilevel threshold voltage distributions depending on the results of the lower page read. According to various embodiments (and assuming for this example an RTS having 5 members) for one possible upper page read the 6 bins can be associated with an RTS, e.g., corresponding to hard read level 1 (RL1) 468 to determine between the 11 data state distribution 460 and the 01 data state distribution 462. 6 bins can be numbered Y1, Y2, Y3, Y4, Y5, and Y6 from left-to-right. With this arrangement, if the lower page data state is 1, a strong 1 on an upper page read corresponds to bin Y1 and a strong 0 on an upper page read corresponds to bin Y6.

For the other possible upper page read, the 6 bins can be associated with an RTS corresponding to hard read level 3 (RL3) 470 so as to determine between the 00 data state distribution 464 and the 10 data state distribution 466. The 6 bins can be numbered Y7, Y8, Y9, Y10, Y11, and Y12 from left-to-right. With this arrangement, if the lower page data state is 0, a strong 1 on an upper page read corresponds to bin Y12 and a strong 0 on an upper page read corresponds to bin Y7.

LLRs can be computed for the Y1-Y6 bins and the Y7-Y12 bins according to the methods discussed above. After computing an LLR for one or more bins, each LLR can be quantized, for example, to a z-bit value, for example. Greater precision can be realized with more digits of soft data at a cost of having to process the additional data. More LLR quantization can be implemented in hardware, for instance. If z=4, the quantized LLR value can come from the set {−7, −6, −5, −4, −3, −2, −1, 0, 1, 2, 3, 4, 5, 6, 7}, for example, since these values can be expressed using 4 bits.

Figure 5:
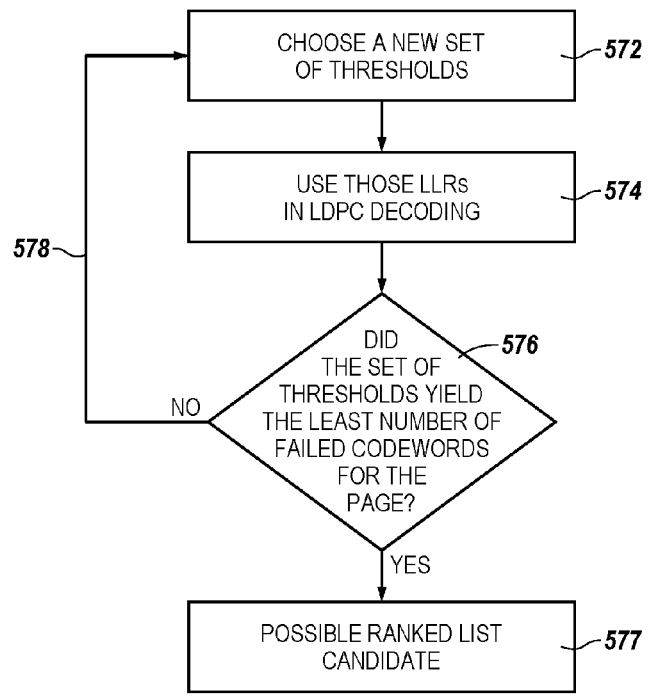
FIG. 5 is a flow chart of a method for testing LLR calibration, in accordance with a number of embodiments of the present disclosure.

FIG. 5 is a flow chart of a method for testing LLR calibration, in accordance with a number of embodiments of the present disclosure. According to various embodiments of the present disclosure, a soft read threshold location calibration procedure is closed-loop, not open-loop as in previous approaches. As shown at 572, a set of soft read thresholds, e.g., 5, is chosen. In some previous approaches, soft read thresholds are chosen based on maximizing an open-loop metric such as mutual information (MI) between a bit written in a memory cell on a particular page and the bins associated with the set of soft read thresholds.

According to various embodiments of the present disclosure, an iterative loop can be implemented to compute LLRs for the bins associated with the thresholds and use the computed LLRs in LDPC decoding (as shown at 574) and determine whether the set of soft read thresholds yield some quantity, e.g., the least number, of failed (LDPC) codewords for the memory cells being decoded, e.g., page, as shown at 576. As used herein, "least" refers to the smallest quantity of failed codewords actually achieved by an RTS, not the least possible quantity of codewords that could fail, e.g., 0. If the set of soft read thresholds did not yield a least number of failed (LDPC) codewords, another set of soft read thresholds can be tested. If the set of soft read thresholds did yield a least number of failed (LDPC) codewords, then that set of soft read thresholds is a possible ranked list candidate, as discussed further with respect to FIG. 6. The iterative process can continue until a set of soft read thresholds yields the least number of failed (LDPC) codewords (or greatest amount of successfully-decoded codewords).

The iterative testing of set(s) of soft read thresholds can be carried out for a particular portion of memory, e.g., page-basis, block-basis, etc. A page of data can have more than one codeword. For example, 8K bytes of data can be comprised of 3 or 4 codewords, for example. If all 3 or 4 codewords do not fail to decode, e.g., are cleared, by the LDPC decoder using LLRs from a particular set of soft read thresholds then the set of soft read thresholds can be determined to yield the least number of failed (LDPC) codewords.

The process illustrated in FIG. 5 includes processing by the LDPC decoder. An LLR can be generated for use by the LDPC decoder, having the LDPC decoder in the loop in validating the set of soft read thresholds is beneficial. The closed-loop technique illustrated in FIG. 5 can result in superior performance relative to previous open-loop approaches for choosing soft read thresholds.

Figure 6:
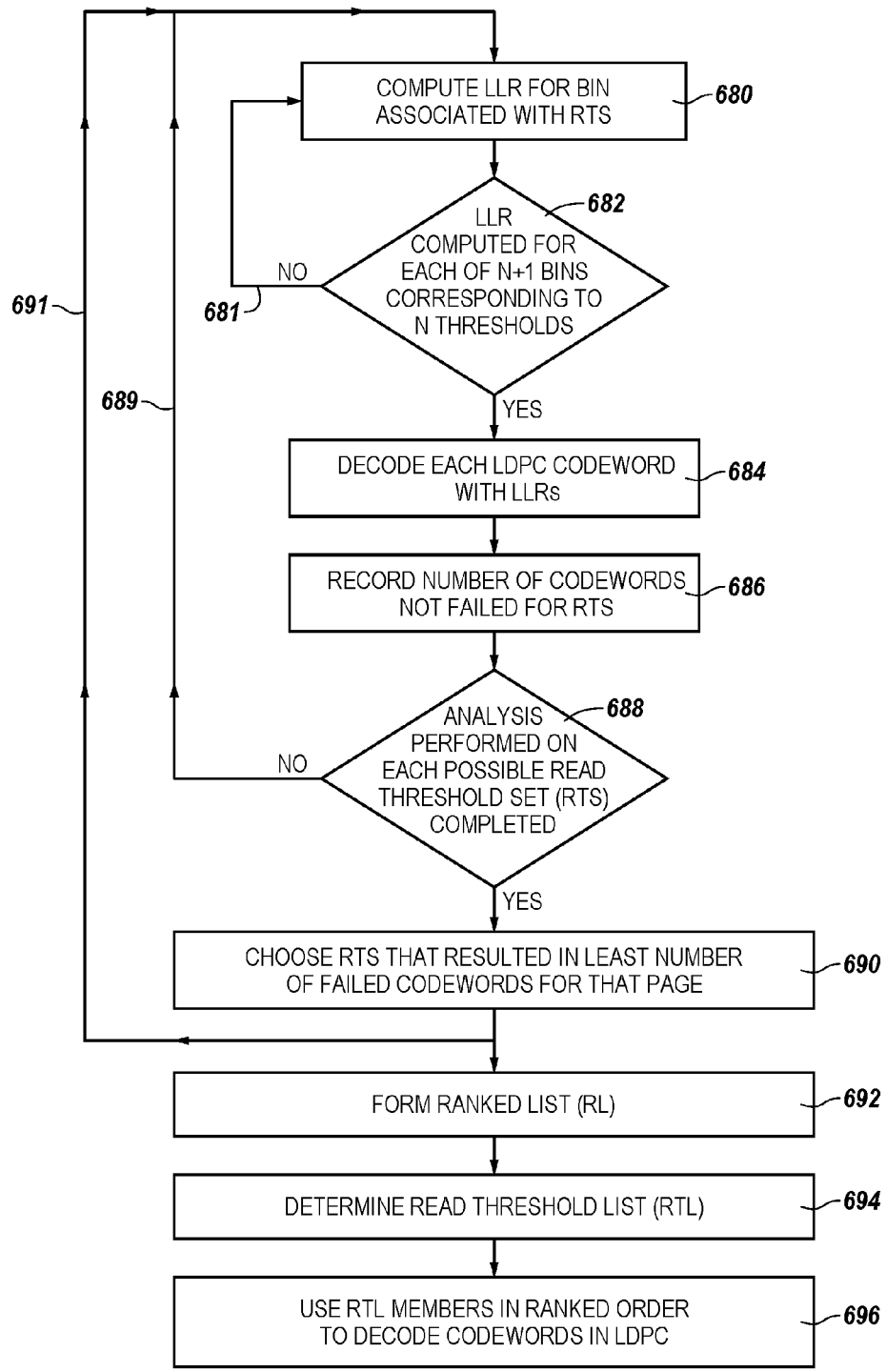
FIG. 6 is a flow chart of a method for LLR calibration, in accordance with a number of embodiments of the present disclosure.

FIG. 6 is a flow chart of a method for LLR calibration, in accordance with a number of embodiments of the present disclosure. FIG. 6 provides a more detailed flow chart than that shown in FIG. 5. The process shown in FIG. 6 also tests each set of soft read thresholds rather than exiting when a set of soft read thresholds yields the least number of failed (LDPC) codewords, e.g., 0.

According to various embodiments of the present disclosure, for each possible RTS, an LLR is computed for a bin associated with the soft read thresholds comprising the RTS (previously discussed) as shown at 680. At 682, an LLR is computed for each of the N+1 bins corresponding to the N (soft read) thresholds comprising the RTS. If not, the process loops back at 681 to compute LLRs for an additional bin associated with the RTS until an LLR is computed for each bin.

As was discussed with respect to FIG. 5, each LDPC codeword written in a portion of memory, e.g., page, is decoded with the computed LLRs as shown at 684. At 686, the number of codewords that did not fail to decode, e.g., cleared, for the RTS is recorded. The above analysis is performed on each possible RTS, e.g., 3003 possible RTSs each comprised of one of the unique combinations of 5 soft read thresholds of 15 initial soft read thresholds, as indicated at 688. Until LDPC decoding is tested using all RTSs, the process loops back as shown at feedback 689. When decoding is completed, the process exits the RTS looping and continues on as discussed further below.

Once all RTSs are tested, the process continues to choose one or more RTS that resulted in the least number of failed codewords for that portion of the memory (or alternatively the one or more RTS that resulted in the greatest number of successfully-decoded codewords). According to some embodiments only one RTS that resulted in the least number of failed codewords for that portion of the memory is chosen. The chosen one RTS can be one of many RTSs that resulted in the least number of failed codewords for that portion of the memory as shown at 690. The one or more RTS that resulted in the least number of failed codewords for that portion of the memory can be referred to as a good read threshold set (GRTS). According to experimental testing, there can be multiple GRTSs.

The above-described process of testing RTSs can be repeated for other portions of memory, e.g., other pages, as shown by feedback loop 691. At 692 a ranked list (RL) is formed. For each RTS, the quantity of pages for which the RTS is a GRTS can be recorded. The RL can comprise RTS that are GRTSs. The rank of a particular RTS in the RL can be determined by the quantity of pages for which the particular RTS is a GRTS, the higher the count, the higher the rank of the RTS in the RL. Some RTS may not be a GRTS for any portions of memory; and therefore, are not included in the RL.

From the RL, a read threshold list (RTL) can be determined as shown at 694. The RTL is a subset of the RL comprised of some RTSs in the RL. The top-ranked RTS in the RL can be the first member of the RTL, e.g., RTL(1). Proceeding down the RL, a determination is made for each successive RTS on the RL as to whether the RTS is a GRTS for a portion of memory, e.g., page(s) for which no RTS on the RTL is a GRTS. That is, the next RTS in the RL that is a GRTS for some pages for which RTL(1) is not a GRTS can be added to the RTL, e.g., RTL(2). It is acceptable if RTL(2) is a GRTS for some portion of memory for which RTL(1) is also a GRTS so long as RTL(2) is a GRTS for some portion of memory that RTL(1) is not a GRTS. RTSs are added to the RTL until at least one RTS on the RTL is a GRTS for each portion of memory. That is, RTSs are added to the RTL by evaluating RTSs from the RL in ranked order until the RTS in the RTL cover all portions, e.g., all pages, of the memory. According to some embodiments, building the RTL stops once all portions of the memory have a GRTS on the RTL. According to experimental data, the RTL might only have a few members, e.g., 5, compared to the 3003 possible RTSs comprised of 5 soft read thresholds of 15 initial soft read thresholds.

After the RTL is formed, RTL members can be used in ranked order to decode codewords in the LDPC decoder, as shown at 696. That is, an attempt can be made to decode a first LDPC codeword using the LLRs associated with the RTS that is RTL(1). If decoding is successful using RTL(1), then an attempt can be made to decode a next, e.g., second, codeword again beginning with using RTL(1). If decoding is not successful using RTL(1), then an attempt can be made to decode the first LDPC codeword using the LLRs associated with the RTS that is RTL(2), and so on making attempts to decode using members of the RTL in ranked order until the codeword clears, e.g., successful decode, or a failed attempt has been made on that codeword with each RTL member.

One example of experimental data implementing the above-described techniques involved a 2 bits-per-cell MLC Flash memory arranged to have 124 lower pages and 8 SLC pages. Each page had 3 LDPC codewords for a total of 396 LDPC codewords. A particular block of the memory was programmed and erased 11,000 times resulting in a RBER of 6.8e-3 for the block. The RTL included five members: RTL(1)={4, 7, 8, 9, 11}, RTL(2)={3, 7, 8, 9, 10}, RTL(3)={4, 7, 8, 9, 12}, RTL(4)={6, 7, 8, 9, 10}, and RTL(5)={4, 6, 9, 10, 11}. RTL(1) was a GRTL for 113 pages, RTL(2) was a GRTL for 3 additional pages (for which RTL(1) was not a GRTL), RTL(3) was a GRTL for 1 additional page (for which RTL(1) and RTL(2) were not a GRTL), RTL(4) was a GRTL for 2 additional pages (for which RTL(1)-RTL(3) were not a GRTL), and RTL(5) was a GRTL for 1 additional page (for which RTL(1)-RTL(4) were not a GRTL). Twelve pages were not helped by any of the 3003 RTS.

According to the above-mentioned experiments, initial soft read thresholds 1, 2, 3, 14, and 15 did not appear as part of any RTS that was a GRTS, which might indicate that similar results could be achieved using fewer initial soft read thresholds, such as 10 (even number) or 11 (odd number) instead of 15. Reducing the quantity of initial soft read thresholds to 10 reduces the number of possible unique RTSs having 5 members to 252 instead of 3003. Having only 252 RTSs to evaluate rather than 3003 can speed up determining the RTL.

According to various embodiments, the RTL can be determined initially and/or periodically. For example, a determined RTL can be pre-loaded into a memory. The RTL might be re-determined for particular portions of memory, e.g., blocks, or re-determined for a particular device, or re-determined according to time, wear, or other measure. According to certain embodiments, an RTL can be determined, e.g., re-determined, when a particular number or rate of codewords are not being cleared.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    determining log-likelihood-ratios (LLRs) that correspond to a number of bins associated with a plurality of selected read threshold sets (RTSs);
    decoding low-density parity-check (LDPC) codewords using the determined LLRs;
    identifying, via a controller comprising control circuitry, a subset of the selected RTSs yielding a lowest rate of failed codewords decoded using the determined LLRs; and
    identifying, via the controller, a RTS of the subset of selected RTSs that yields the lowest rate of failed codewords decoded based, at least in part, on a determination of a good read threshold (GRTS) for at least one page of a memory.

2. The method of claim 1, further comprising identifying, via the controller, a plurality of initial read thresholds (IRTs) around a transition between voltage distributions corresponding to respective data states.

3. The method of claim 1, further comprising identifying, via the controller, a RTS of the subset of selected RTSs that yields a lowest rate of failed codewords decoded using the determined LLRs.

4. The method of claim 1, further comprising generating a read threshold list (RTL) by adding RTSs that correspond to good read thresholds (GRTSs) for each page of a memory.

5. The method of claim 1, further comprising identifying, via the controller, a plurality of initial read thresholds (IRTs) around a transition between voltage distributions corresponding to two data states.

6. The method of claim 1, further comprising selecting the subset of the selected RTSs from a plurality of initial read thresholds (IRTs).

7. An apparatus, comprising:
a memory; and
a controller coupled to the memory, the controller configured to:
select subsets of a plurality of initial read thresholds (IRTs) as read threshold sets (RTSs);
generate a read threshold list (RTL) in response to a particular rate of codewords not being cleared; and
determine whether a threshold associated with at least one RTS is charged to a voltage greater than or less than the threshold to determine a data state associated with a particular memory cell of the memory.

8. The apparatus of claim 7, wherein the controller is configured to generate the RTL by adding RTSs that correspond to good read thresholds (GRTSs) for each page of the memory.

9. The apparatus of claim 7, wherein the controller is configured to determine log-likelihood-ratios (LLRs) based on a number of decisions that correspond to a number of bins associated with each RTS.

10. The apparatus of claim 9, wherein the controller is configured to form a ranked list of RTSs based on a quantity of portions of the memory for which a respective RTS has a lowest rate of failed codewords decoded with the determined LLRs associated with the RTS.

11. The apparatus of claim 10, wherein the controller is further configured to:
select a highest-ranked RTS of the ranked list as a highest-ranked RTS of the RTL; and
select additional RTSs in ranked order from the ranked list that have the lowest rate of failed codewords decoded with the determined LLRs associated with the RTS for portions of the memory for which other RTSs of the RTL do not have the lowest rate of failed codewords decoded with the LLRs associated with the other RTSs.

12. The apparatus of claim 7, wherein the controller is configured to decode low density parity check (LDPC) codewords using at least one member of the RTL.

13. The apparatus of claim 12, wherein the controller is further configured to attempt to decode LDPC codewords using a highest-ranked member of the RTL.

14. The apparatus of claim 12, wherein the controller is further configured to attempt to decode LDPC codewords using successive members of the RTL in ranked order.

15. An apparatus, comprising:
a memory; and
a controller coupled to the memory and configured to:
select subsets of a plurality of initial read thresholds (IRTs) as read threshold sets (RTSs);
identify an RTS having a least number of failed low-density parity-check (LDPC) codewords decoded with a log-likelihood-ratio (LLR) associated with the RTS;
form a ranked list of RTSs based on a number of failed LDPC codewords decoded with LLRs associated with the RTS; and
determine at least one good read threshold set (GRTS) using the ranked list of RTSs that results in a least number of failed LDPC codewords.

16. The apparatus of claim 15, wherein the controller is further configured to generate a read threshold list (RTL) including RTSs from the ranked list.

17. The apparatus of claim 15, wherein the controller is configured to periodically re-determine a new RTL based, at least in part, on time or quantity of codewords not cleared during a decoding operation.

18. The apparatus of claim 15, wherein the controller is configured to periodically re-determine a new RTL based, at least in part, on a rate of codewords not cleared during a decoding operation.

19. The apparatus of claim 15, wherein the controller is configured to identify at least one IRT among the plurality of IRTs based on the at least one IRT yielding a lowest residual bit error rate.

\* \* \* \* \*